(12) United States Patent
Bardell et al.

(10) Patent No.: US 6,937,119 B1
(45) Date of Patent: Aug. 30, 2005

(54) HIGH FREQUENCY APPARATUS

(75) Inventors: Stephen Bardell, Barnston (GB); Mark Bridges, Leigh-on-Sea (GB); James R Johnson, Chelmsford (GB); Andrew Sleet, Chelmsford (GB); Stuart W Andrews, Colchester (GB)

(73) Assignee: E2V Technologies (UK) Limited, Chelmsford (GB)

(*) Notice: Subject to any disclaimer, the term of this patent is extended or adjusted under 35 U.S.C. 154(b) by 0 days.

(21) Appl. No.: 10/089,536

(22) PCT Filed: Oct. 2, 2000

(86) PCT No.: PCT/GB00/03757

§ 371 (c)(1),
(2), (4) Date: Jul. 30, 2002

(87) PCT Pub. No.: WO01/26178

PCT Pub. Date: Apr. 12, 2001

(30) Foreign Application Priority Data

Oct. 6, 1999 (GB) ............................................. 9923226

(51) Int. Cl.[7] .............................. H01P 7/06; H01J 23/20

(52) U.S. Cl. ...................................... 333/233; 315/5.54

(58) Field of Search ................................ 333/233, 223, 333/231, 232; 315/5.48, 5.54

(56) References Cited

U.S. PATENT DOCUMENTS

| | | | | |
|---|---|---|---|---|
| 2,428,287 A | * | 9/1947 | Linder | 333/33 |
| 2,737,631 A | * | 3/1956 | Beck et al. | 333/233 |
| 3,581,190 A | * | 5/1971 | Brown | 324/318 |

FOREIGN PATENT DOCUMENTS

| | | |
|---|---|---|
| DE | 940 364 | 7/1949 |
| FR | 2 451 111 | 10/1980 |
| GB | 594 406 | 2/1947 |
| GB | 588526 | 5/1947 |
| GB | 635 619 | 4/1950 |
| GB | 647 442 | 12/1950 |
| GB | 813 711 | 5/1959 |
| GB | 2 140 976 A | 12/1984 |

* cited by examiner

*Primary Examiner*—Dean Takaoka
(74) *Attorney, Agent, or Firm*—Kirschstein, et al.

(57) ABSTRACT

A tuning door is fabricated for a resonant cavity of a high frequency apparatus. Contact fingers are formed around the edge of a conductive plate. The plate is then fixed to a support by, for example, double sided adhesive tape. The conductive plate is part of the interior surface of the resonant cavity. The fingers may be formed in one operation, for example, by photoetching and are fully integral with the active surface to give optimum electrical conduction between them. Other types of high frequency apparatus may use contact fingers to provide electrical conduction between a movable wall and an adjacent conductive surface.

16 Claims, 3 Drawing Sheets

HIGH FREQUENCY APPARATUS

BACKGROUND OF THE INVENTION

This invention relates to high frequency apparatus and more particularly, but not exclusively, to apparatus which includes a high frequency resonant cavity tuning member which is moveable to vary the volume, and hence resonant frequency, of a cavity.

DESCRIPTION OF THE RELATED ART

High frequency devices, such as, for example klystrons and inductive output tubes (IOTs), include resonant cavities in which energy of appropriate frequency is contained, electrical current moving over the interior surfaces of the cavity. The resonant frequency of a cavity may be tuned by altering its volume, one or more walls of the cavity being moveable relative to the other walls. A moveable wall of this type is commonly referred to as a "tuning door". In order for the cavities to have an effectively continuous electrical surface at the high frequencies involved, spring fingers are attached to the tuning door or doors and are pushed into contact with the adjacent fixed walls. This mechanism gives the required electrical connection whilst permitting movement of the tuning door.

FIG. 1 schematically shows a known tuning door arrangement for a resonant cavity in which a tuning door 1 is moveable, in the directions shown by the arrows, relative to surrounding walls 2. The tuning door 1 has an active surface 3 that is, an interior surface of the cavity over which current flows. Strips of spring contact fingers, three of which are shown at 4,5 and 6, are clamped to the rear surface of the door 1 via screw 7 and clamping plates 8. The screws 7 provide an electrical path between the interior active surface 3 of the tuning door 1 and the contact fingers 4, 5 and 6. The contact fingers 4, 5 and 6 bear against the surrounding walls 2 to provide electrical connection thereto. Strips are distributed around the entire periphery of the tuning door 1. In the arrangement shown in FIG. 1, one strip is fastened to each edge of the tuning door 1. In other more complex shaped tuning doors, several strips of contact fingers may be required along an edge of a door.

SUMMARY OF THE INVENTION

According to a first aspect of the invention, high frequency apparatus comprises a moveable wall having a support which carries an electrically conductive plate, being an active surface during use, with a plurality of contact fingers at the periphery of the wall which are integral with the conductive plate.

By "active surface" it is meant that the surface forms part of a cavity or transmission line for high frequency radiation.

By using the invention, fabrication of cavity tuning doors or other moveable components is greatly simplified compared to prior art assemblies. The contact fingers around the periphery of the conductive plate may be formed in a single operation. This contrasts with a conventional construction in which a plurality of separate strips of electrical contact fingers are separately manufactured and are then individually screwed to the cavity tuning door, each strip requiring several screws to hold it in position to the door. In the present invention, all of the electrical contact fingers may be fixed to, say, a cavity tuning door in one operation. Another advantage is that because the fingers are integral with the conductive plate, there is optimum electrical connection between them, unlike the previous arrangement where there is a risk that the strips are not properly connected to the front active surface.

The electrical contact fingers should be sufficiently flexible and springy so as to provide a good electrical contact with surrounding surfaces and thus the conductive plate should be sufficiently thin and of a suitable material to achieve this.

The support may provide a complete backing member to the conductive plate, being of substantially the same area and shape as the plate. In alternative embodiments, however, the support may be provided by a framework, reducing the material required and the weight of the apparatus.

Preferably, a single conductive plate covers the entire region of the wall. However, a plurality of plates may be fixed to the support to define the active surface. This however introduces Additional fabrication steps and it is important for good electrical performance that adjoining plates are accurately aligned with one another. Where several conductive plates are used for a single moveable wall, electrical contact fingers will be provided around only part of the periphery of each plate.

The invention is particularly applicable to resonant cavity tuning doors but it may also be used in other types of apparatus where electrical connection is required by the use of contact fingers. For example, it may find use for altering the length of waveguide terminations or in screening apparatus such as a Faraday cage, to shield from external electrical influences.

According to a second aspect of the invention, a method for manufacturing a moveable wall for high frequency apparatus includes the steps of taking a plate of conductive material; forming contact fingers at the periphery of the plate; and then mounting the plate on a support.

Typically, the plate is of beryllium copper and following the formation of the fingers and any subsequent bending to form the fingers into the right configuration to give a spring "spoon" shape, the plate is gold or silver plated. This gives a good electrically conductive active surface and reduces or eliminates atmospheric tarnishing. The plate may be silver plated and the tips of the contact fingers gold plated.

The fingers may preferably be formed by etching for example by photo etching, giving good accuracy as this can be computer controlled. Other techniques involving cutting or stamping could be used instead.

The design flexibility afforded by the invention permits the configuration of the fingers and/or their spatial distribution to be quite complex if necessary, for example to take into account the configuration of the moveable wall in the finished apparatus. For example, where the wall is curved, the finger profiles may vary along the periphery to give a more uniform distribution of contact points in the final assembly.

The plate may be fixed to the support by, for example, double-sided adhesive tape, fastenings through the plate, clamping the plate to the support, or any other convenient arrangement. Alternatively, a liquid adhesive may be applied to the rear surface of the plate and/or to the support and subsequently cured. An advantage of using liquid adhesive or adhesive tape is that it allows the plate to be attached to the support in one step in the assembly process, and additional fixation components are not required.

BRIEF DESCRIPTION OF THE DRAWINGS

Some ways in which the invention may be performed are now described by way of example with reference to the accompanying drawings in which.

DETAILED DESCRIPTION OF THE PREFERRED EMBODIMENTS

Figure 1:
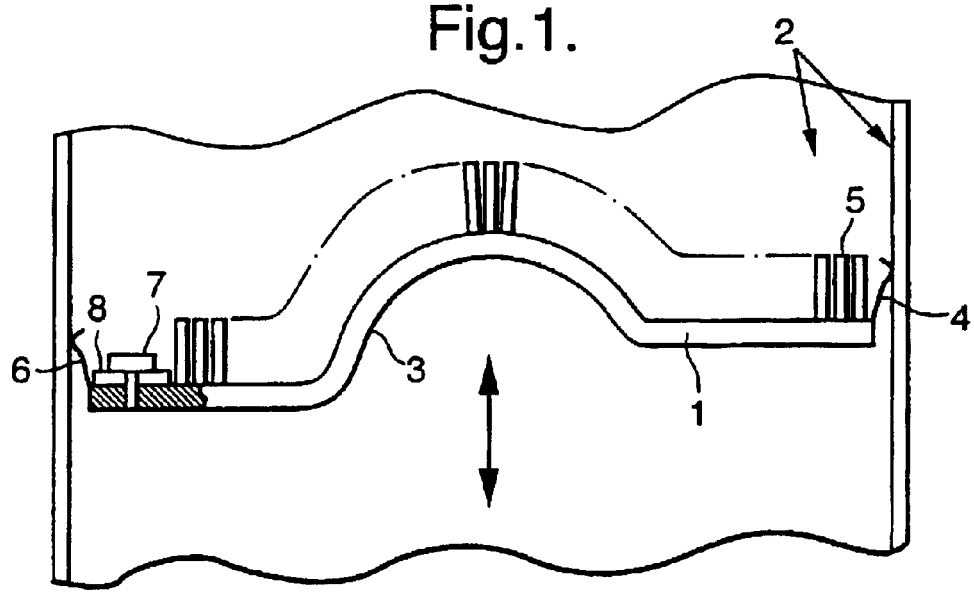
FIG. 1 schematically shows a tuning door arrangement in accordance with the prior art.
Figure 2:
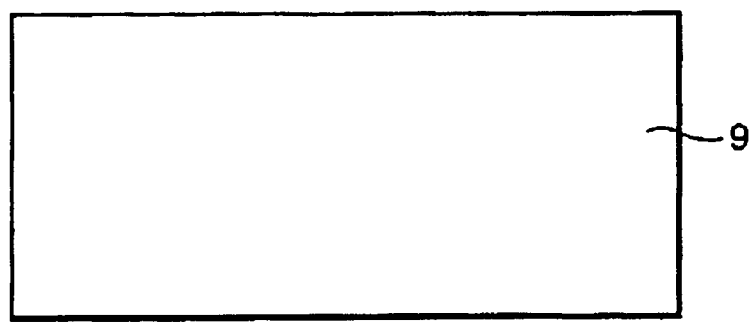
FIGS. 2 to 5 schematically illustrate the steps in a method of manufacturing a tuning door for a resonant cavity included in high frequency apparatus.
Figure 3:
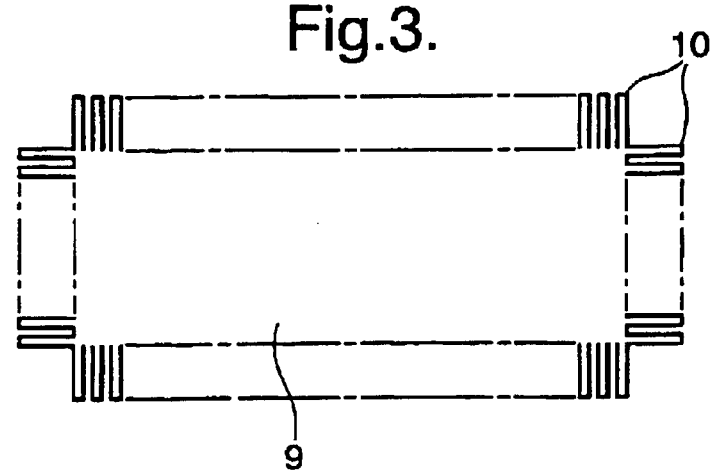
Figure 4:
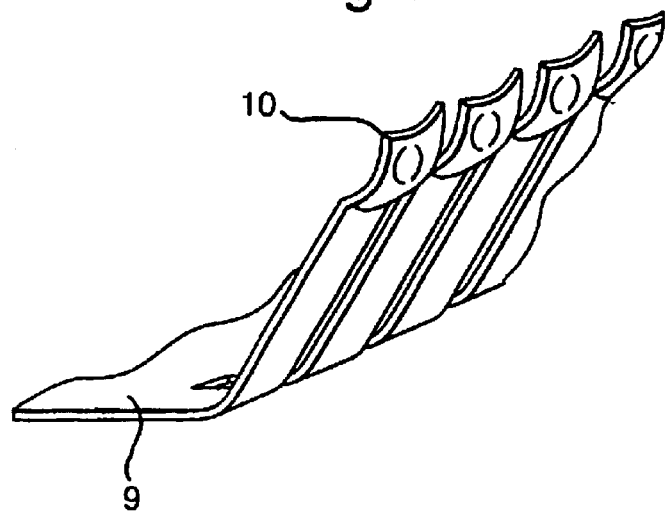

In a method of fabricating a cavity tuning door and with reference to FIG. 2 which is a plan view, firstly, a rectangular plate 9 of beryllium copper is taken. This is etched using conventional photo etching techniques to define a plurality of fingers 10 around the periphery of the plate as shown in FIG. 3, also a plan view. In this case, the fingers 10 are formed around the entire periphery of the plate 9. Following this step, the fingers 10 arm bent at right-angles to the plane of sheet and their ends further curved to give the spring "spoon" shape, as shown in FIG. 4 which is an isometric view. The plate is then silver plated to give a good conductive surface.

Figure 5:
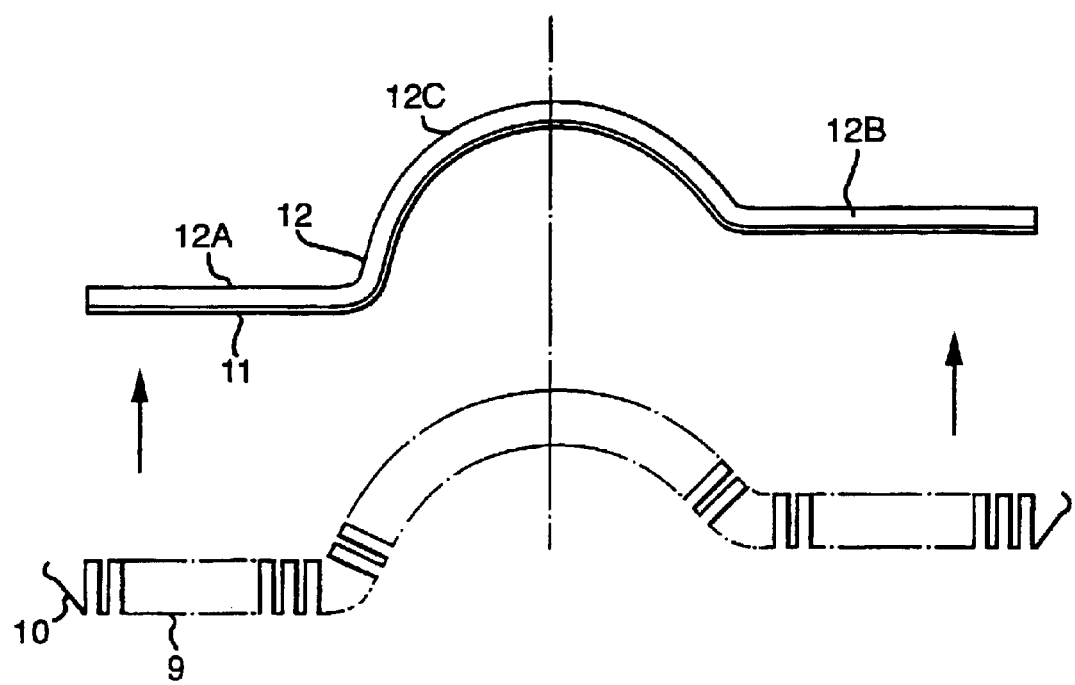

As shown in FIG. 5, double-sided adhesive tape 11 is then applied to the surface of a support 12, the plate 9 and support 12 being illustrated with their major surfaces normal to the page. In this case the support 12 has the same shape as the tuning door in the finished device. It has two flat planar parts 12A and 12B and a central part-cylindrical part 12C. The plate 9 is offered up and fixed to the support 12 by means of the adhesive tape 11, to thus form the tuning door.

Figure 6:
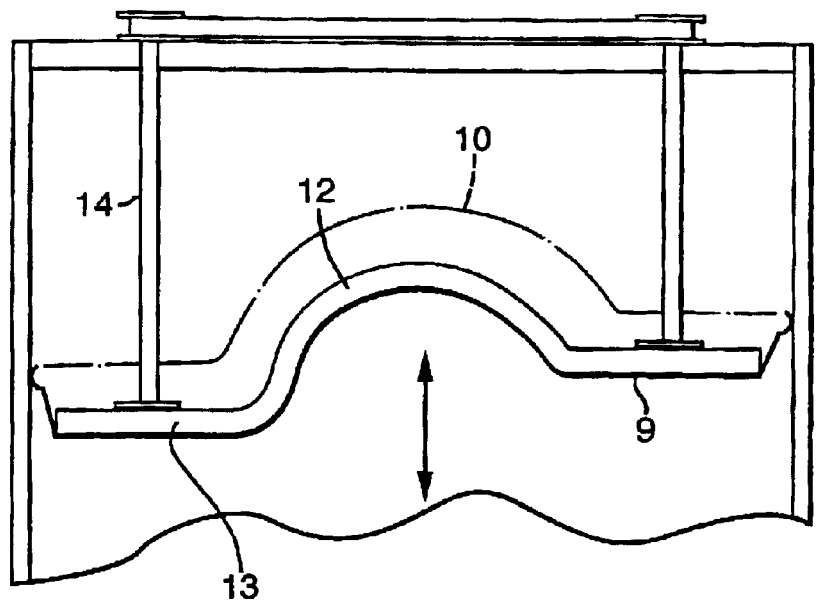
FIG. 6 schematically shows the finished apparatus tuning door in situ in a resonant cavity, only part of which is shown.

As shown in FIG. 6, the tuning door 13 is then incorporated into the resonant cavity, being moveable in the directions shown by the arrows by means of mechanism 14 at the rear of the support 12.

Figure 7:
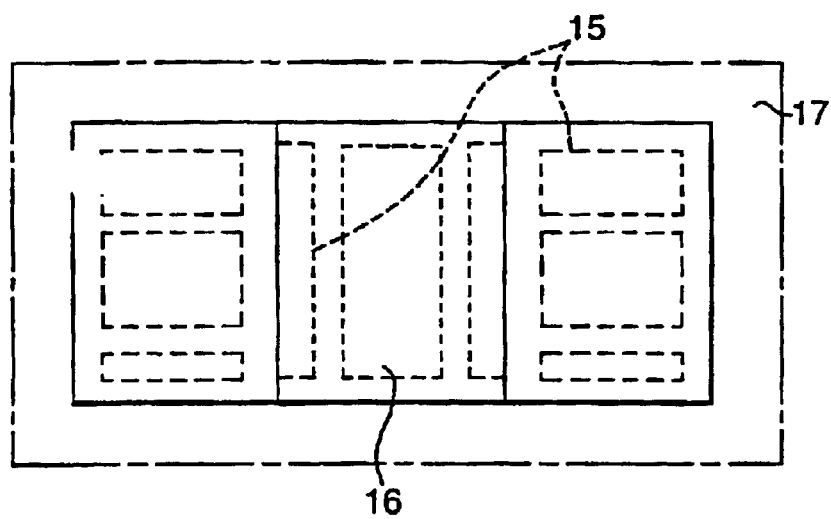
FIGS. 7 and 8 schematically illustrate in plan view other tuning doors in accordance with the invention.

FIG. 7 shows an alternative arrangement, in which the support consists of an open framework 15 on which the plate 16 is mounted, the contact fingers being indicated at 17. The tuning door is of similar shape to that shown in FIG. 6, having a central part-cylindrical part.

Figure 8:
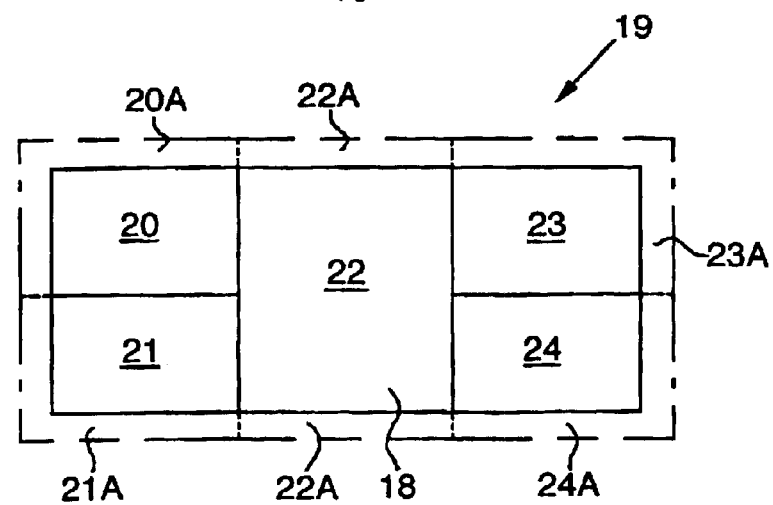

In another arrangement shown in FIG. 8, the conductive surface 18 of a tuning door 19 is formed from several separate conductive plates 20, 21, 22, 23 and 24 located adjacent one another. Each of these conductive plates 20 to 24 has fingers 20A to 24A formed along only part of its periphery.

What is claimed is:

1. A high frequency apparatus, comprising:
    a) a movable wall having a support which carries an electrical conductive plate, and being an active surface during use, the support having substantially the same area and shape as that of the conductive plate; and
    b) a plurality of contact fingers at a periphery of the movable wall and being integral with the conductive plate, the contact fingers being arranged to extend behind the support.

2. The apparatus as claimed in claim 1, wherein the support is a framework.

3. The apparatus as claimed in claim 1, wherein the movable wall is a tuning door for a resonant cavity.

4. The apparatus as claimed in claim 1, wherein the conductive plate is constituted of beryllium copper.

5. The apparatus as claimed in claim 1, wherein the conductive plate is gold plated.

6. The apparatus as claimed in claim 1, wherein the conductive plate is silver plated.

7. A high frequency apparatus, comprising:
    a) a movable wall having a support which carries an electrical conductive plate, and being an active surface during use, the active surface of the movable wall being defined by a single conductive plate; and
    b) a plurality of contact fingers at a periphery of the movable wall and being integral with the conductive plate, the contact fingers being arranged to extend behind the support.

8. A high frequency apparatus, comprising:
    a) a movable wall having a support which carries an electrical conductive plate, and being an active surface during use; and
    b) a plurality of contact fingers at a periphery of the movable wall and being integral with the conductive plate, the contact fingers being arranged to extend behind the support, the contact fingers being arranged around the entire periphery of the movable wall.

9. A high frequency apparatus, comprising:
    a) a movable wall having a support which carries an electrical conductive plate, and being an active surface during use, the conductive plate being fixed to the support by an adhesive; and
    b) a plurality of contact fingers at a periphery of the movable wall and being integral with the conductive plate, the contact-fingers being arranged to extend behind the support.

10. The apparatus as claimed in claim 9, wherein the conductive plate is fixed to the support by an adhesive tape.

11. A method of manufacturing a movable wall for a high frequency apparatus, comprising the steps of:
    a) taking a plate of a conductive material;
    b) forming contact fingers at a periphery of the plate by photoetching; and
    c) then mounting the plate on a support, and arranging the contact fingers to extend behind the support.

12. The method as claimed in claim 11, wherein the plate is constituted of beryllium copper.

13. The method as claimed in claim 11, and the step of plating the plate with gold.

14. The method as claimed in claim 11, and the step of plating the plate with silver.

15. A method of manufacturing a movable wall for a high frequency apparatus, comprising the steps of:
    a) taking a plate of a conductive material;
    b) forming contact fingers at a periphery of the plate; and
    c) then mounting the plate on a support by fixing the plate to the support by an adhesive, and arranging the contact fingers to extend behind the support.

16. The method as claimed in claim 15, and the step of fixing the plate to the support by an adhesive tape.

* * * * *